United States Patent

Broyde

[15] 3,661,582

[45] May 9, 1972

[54] ADDITIVES TO POSITIVE PHOTORESISTS WHICH INCREASE THE SENSITIVITY THEREOF

[72] Inventor: Barret Broyde, Highland Park, N.J.

[73] Assignee: Western Electric Company, Incorporated, New York, N.Y.

[22] Filed: Mar. 23, 1970

[21] Appl. No.: 21,989

Related U.S. Application Data

[63] Continuation-in-part of Ser. No. 833,077, June 13, 1969, abandoned.

[52] U.S. Cl. ....................................96/36.2, 96/36, 96/91 D

[51] Int. Cl. .....................................................................G03c

[58] Field of Search ....................................96/36, 91 D, 36.2

[56] References Cited

UNITED STATES PATENTS

| | | | |
|---|---|---|---|
| 2,907,655 | 10/1959 | Schmidt et al. | 96/91 D |
| 3,046,113 | 7/1962 | Schmidt et al. | 96/91 D |
| 3,402,044 | 9/1968 | Steinhoff et al. | 96/91 D |

OTHER PUBLICATIONS

RRI – Ring Index, 2nd Ed., Am. Chem. Soc. pp. 17, 116, 146, 157, 159, 168, 218 & 220

DOC – Dictionary of Organic Compounds, 4th Ed. Vol. 1 pp. 299 & 305

*Primary Examiner*—Norman G. Torchin
*Assistant Examiner*—J. Winkelman
*Attorney*—R. C. Winter

[57] ABSTRACT

The use of a scanning electron beam to generate a pattern in a positive photoresist is known. Electron beam equipment can be made which is capable of scanning very quickly, but standard positive photoresists require such a large flux of electrons for proper exposure that the scanning equipment must be operated at speeds substantially slower that the capability of the equipment. It has been discovered that by adding certain compounds to photoresists of the quinone diazid type, the sensitivity or speed of the photoresist is substantially increased. As a result, the electron beam can scan at a higher rate. The same compounds also increase the sensitivity of the photoresist to light. Compounds which are operable include aromatic compounds soluble in the resist and having two or more nitrogen atoms, at least one of which is bonded to a hydrogen atom. The ring can contain no other heterocyclic atoms and the nitrogens can not be bonded to other than nitrogen, carbon or hydrogen atoms. This definition includes most, but not all, of the compounds which have been determined to be operable.

14 Claims, 3 Drawing Figures

Figure 1:
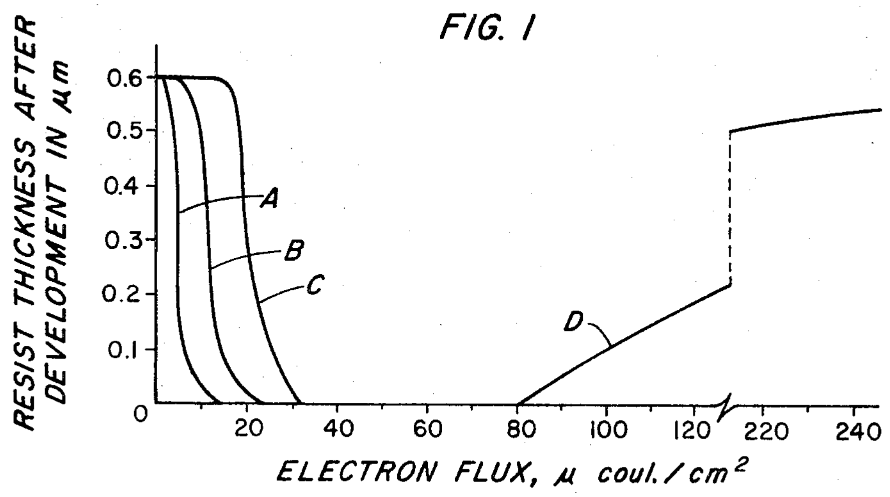

INVENTOR
B. BROYDE
BY MARN & JANGARATHIS
ATTORNEYS

ADDITIVES TO POSITIVE PHOTORESISTS WHICH INCREASE THE SENSITIVITY THEREOF

CROSS REFERENCE TO RELATED APPLICATIONS

This application is a continuation-in-part of U.S. application Ser. No. 833,077 filed June 13, 1969 in the name of B. Broyde and assigned to Western Electric Company, Inc.

BACKGROUND OF THE INVENTION

1. Field of the Invention

This invention relates generally to additives to positive photoresists which increase the sensitivity thereof and, more particularly, the invention relates to additives to particular positive photoresists which result in increased reactivity of the photoresist. The invention has particular application in, but is not limited to, the generation of microminiature circuit patterns by electron beam or light exposure of positive photoresists.

2. Discussion of the Prior Art

A positive photoresist is an organic material, which, when exposed to radiation, undergoes chemical reactions which result in solubilizing the exposed areas. Until recently these reactions had to be initiated by light rather than electrons. However, Haller et al. (IBM Journal, May 1968, pp. 251–256) reported successful results exposing cellulose acetate and poly-(methyl methacrylate) to electron beams. Because it is possible to generate electron beams of substantial energy but of only 0.1$\mu$ or smaller diameter, their use in the generation of extremely small circuit patterns may be preferred to the use of light. Electron beams also have a much better resolution capability than is possible when using an optical mask and light exposure, and they have a much greater depth of focus. For these reasons, it is often highly desirable to expose positive photoresists with electron beams. [This also applies to negative photoresists, of course, and they are also amenable to electron bombardment. In this connection, reference is made to copending U.S. applications Ser. Nos. 764,866 and 764,867, filed Oct. 3, 1968 and assigned to the same assignee as the instant application.] Where exposure with light is preferred a more sensitive photoresist will, of course, reduce exposure times.

Prior to considering the present invention in detail, some attention is necessary to the procedures for generating microminiature circuit patterns, in order that the preferred embodiment of the invention will be more fully understood.

The procedures for generating a microminiature circuit pattern by either electron bombardment or light exposure of a positive photoresist are well established, and are summarized briefly below. The substrate is typically an oxidized silicon wafer or a chromium coated glass plate. The photoresist is applied to the substrate, which may then be spun at a high speed to leave an even film of the photoresist, having a controlled thickness, on the substrate surface. Alternatively, the photoresist may be sprayed on. The photoresist-coated substrate is then cured to form an insoluble coating and dried or baked briefly to improve adhesion. The coated substrate is then placed in a vacuum chamber and, when the vacuum has been established, it is radiated in the desired pattern and with an appropriate dosage, with either light or an electron beam. The coated and radiated substrate is then placed in a developer, which is a solvent for the soluble (i.e., exposed) portion of the resist, to dissolve and remove the exposed portions. It is again dried or baked. The desired pattern area on the substrate is now free of any covering film, and etching, plating or oxidizing follows. After this step, the remaining resist is stripped off.

There are a variety of limitations imposed upon the radiation step, which will be summarized here.

Briefly, the amount of radiation must fully expose the photoresist all the way down to the substrate, or else the underlying, insoluble photoresist will not be dissolved in the developer. On the other hand, too much radiation causes a loss of resolution and, ultimately, insolublization. The amount of radiation necessary to solubilize a photoresist is apparently a function of the molecular weight of the material, and the gross amount of radiation.

The efficiency of the solubilizing reactions induced by an electron beam is related to the accelerating potential of the electrons, penetration range (also a function of potential) and other factors. For instance, it has been determined that the maximum film thickness that can be exposed by 5 KV electrons is about 6,500 A, and by 10 KV electrons is about 2 $\mu$. On the other hand, photoresists should initially be at least 6,000 A thick to avoid pinhole problems. Other limitations which must be considered are electron scatter within the film and backscatter from the substrate, though these are of a lesser order.

The efficiency of light-induced solubilization reactions is related to the wavelength of the light and the absorption properties of the photoresist.

A great deal of work has been done in increasing the sensitivity of negative photoresists to light, however the above-noted Haller et al. reference is one of the few literature references specifically directed to the electron beam exposure of positive photoresists. Prior workers in the field of photolithography, where photoresists were first employed, have proposed a large number of compounds as positive photoresists. This work is not readily summarized, but the following references describe the guinone diazid photoresists useful in the present invention. In U.S. Pat. No. 3,402,044, assigned to the Shipley Co., these photoresists are designated as naphthoquinone - (1,2) diazid sulfonic acid esters. The following U.S. patents, all assigned to the Azoplate Corp., described various formulations of the same kind of positive photoresists. U.S. Pat. No. 3,046,111 teaches using several diazid residues by reacting an aminohydroxy compound with sulfonic acid or its chloride. U.S. Pat. No. 3,046,112 defines some of the basic formulae for orthoquinone diazid sulfones as

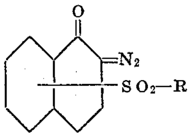

[1]

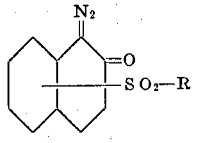

[2]

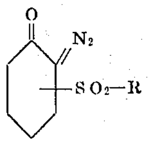

[3]

where R is an aryl or substituted aryl radical. Many variations are proposed, and additions of resins, dyestuffs and other additives are discussed. In U.S. Pat. No. 3,046,115, the addition of an auxochromous group, is said to intensify coloring. In U.S. Pat. No. 3,046,118, it is preferred to have two of the sulfonic acid residues linked in the manner of an ester, so as to reduce the heating required. In U.S. Pat. No. 3,148,983, the following basic formula is proposed:

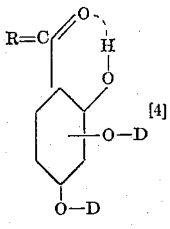

[4]

where D is a naphthoquinone-(1,2)-diazid-(2)-4 sulfonyl radical or a naphthoquinone-(1,2)-diazid-(2)-5-sulfonyl radical, and R is an aryl or substituted aryl radical. Lastly, in U.S. Pat. No. 3,184,310, the inclusion of at least one free hydroxyl group is said to be beneficial, and the following general formula is proposed:

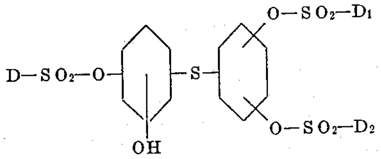

[5]

where D, $D_1$ and $D_2$ are naphthoquinone-(1,2)-diazid groups.

As used herein, the expression "quinone diazid photoresists" is intended to refer generically to all of the foregoing types of compounds.

OBJECTS OF THE INVENTION

A general object of the present invention is to provide new and improved additives to specific, positive photoresists which increase the sensitivity thereof to electrons and to light.

A further object of the present invention is to provide additives to specific, positive photoresists which result in increased reactivity of the photoresist itself.

Another object of the present invention is to improve the sensitivity of specific, positive photoresists by including novel additives therein.

A further object of the present invention is to reduce the radiation and, hence, the exposure time required to fully expose specific, positive photoresists, by incorporating novel additives therein.

Still another object of the present invention is to provide additives to specific positive photoresists which allow greater exposure time without overexposing (i.e., insolubilizing) the photoresist.

Various other object and advantages of the invention will become clear from the following detailed description of several embodiments thereof, and the novel features of the invention will be particularly pointed out in connection with the appended claims.

THE DRAWINGS

Figure 2:
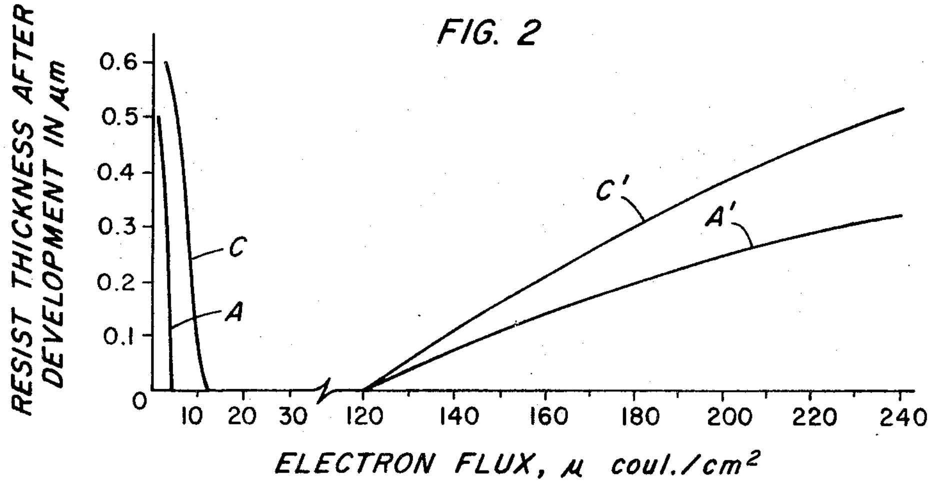
Figure 3:
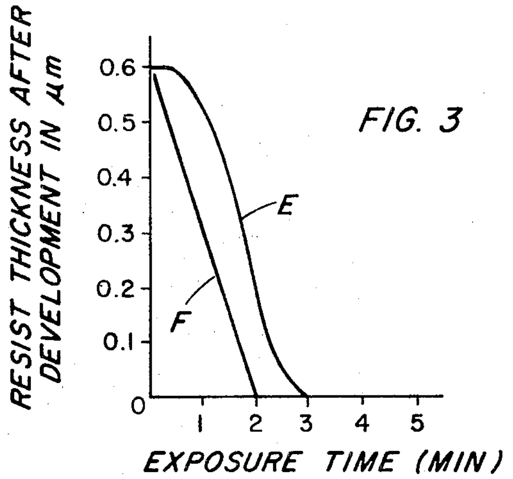

FIGS. 1–2 are plots of resist thickness vs. electron flux density for exposure of 6,000 A films of Shipley 1,350 positive resist and shipley 1,350 plus certain additives of the invention, respectively, FIG. 3 is a plot of resist thickness vs. exposure time to light for exposure of 6,000 A films of Shipley AZ–1350 both alone with an additive of the invention.

SUMMARY AND DESCRIPTION OF EMBODIMENTS

In essence, the present invention comprises the addition, in small amounts, of aromatic and certain other compounds described below to positive photoresists of the quinone diazid type. It is not known why these compounds enhance the sensitivity of these particular resists, and no explanation is offered. That they do provide significantly better results is manifest from the examples set forth below. One group of operative compounds are triazoles, and while other workers have established that certain benzotriazole compounds absorb ultraviolet light, this does not fully explain their apparent sensitivity to electron beams or to light (see, in this regard, U.S. Pat. No. 3,262,943 assigned to E. I. duPont de Nemours and Co.).

It is not known that in film form, quinone diazid photoresists form true polymers or form a high molecular weight compound. However, it is believed that, under the influence of actinic radiation, the oxygen forms a COOH group which is soluble in bases. As sold commercially, however, the photoresists are believed to contain other reactive groups, of a type unknown, as catalyzers, sensitizers, etc. Compatible solvents are used, if necessary, for viscosity control. The positive photoresists of this type utilized in connection with the present invention are sold by various companies, including the Shipley Company under such tradenames as Shipley AZ–1350 and AZ–1350H, and Eastman Kodak Company as KAR–3.

The composition of KAR–3 is not known, but since the additives of the present invention increase the sensitivity thereof, it is presumed that it too is a quinone diazid.

Most of the compounds which have been found operative to increase the sensitivity of quinone diazid photoresists are compounds of an aromatic character that contain two or more nitrogen atoms, at least one of which is bonded to a hydrogen atom. Further, the ring can contain no other heterocyclic atoms, and the nitrogen atoms can not be bonded to atoms other than nitrogen, carbon or hydrogen atoms. Any compound meeting this definition will increase the sensitivity of a quinone diazid resist. These compounds also increase the amount of radiation required to overexpose (i.e., insolubilize) the photoresist. For example, the following compounds fit this definition and are known to be effective:

1H-benzotriazole [6]

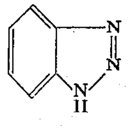

5-methyl-1H-benzotriazole [7]

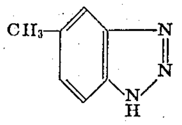

5-chloro-1H-benzotriazole [8]

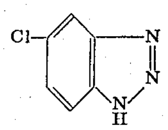

5,6-dimethyl-1H-benzotriazole [9]

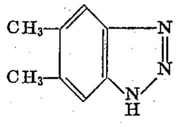

1,2-naphthotriazole [10]

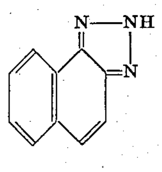

1-H-indazole [11]

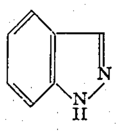

5-nitro-1H-indazole [12]

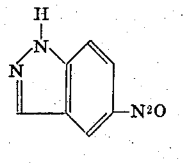

5-amino-1H-indazole [13]

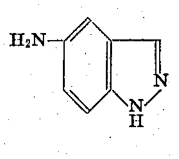

6-amino-1H-indazole [14]

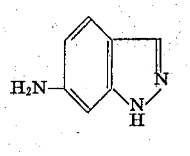

1,3,4-imidazopyridine [15]

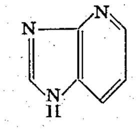

imidazole [16]

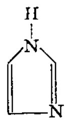

6-azauracil [17]

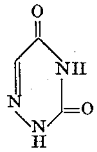

Compounds which have been found to be effective but which do not fit the above general definition are as follows:

quinazoline [18]

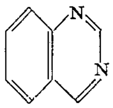

azocyclononan-2-one [19]

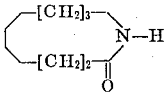

indole [20]

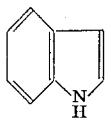

6,7-dihydro-5H-pyrrolotetrazole [21]

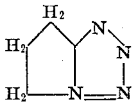

Certain additional compounds, also not fitting the general definition, are not effective in increasing the sensitivity of the photoresists, but do act to prevent overexposure thereof. These are as follows:

3,4-dinitroaniline [22]

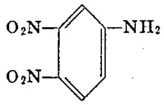

2,3-dimethylquinoxaline [23]

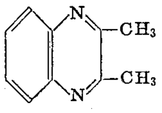

5-nitroindoline [24]

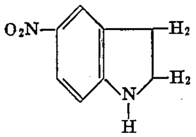

1,3-di-(4-piperidyl)propane [25]

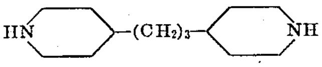

5-nitroindole [26]

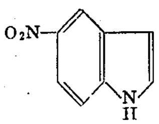

3,4-dichloroaniline [27]

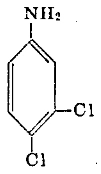

3,4-dimethylaniline [28]

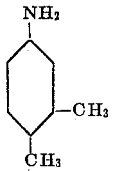

In contrast to the foregoing, the following compounds were found to be ineffective in increasing the sensitivity of these photoresists:

benzothiadiazole [29]

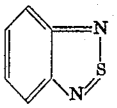

benzoxazole [30]

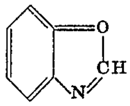

dibutyl p-cresol [31]

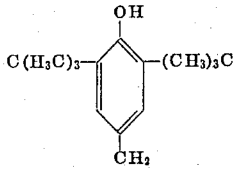

1-(tri n-butylplumbyl)imidazole [32]

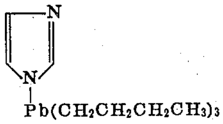

4,4'-trimethylenedipyridine [33]

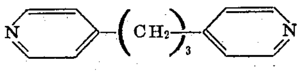

octadecylamine $CH_3-(CH_2)_{17}-NH_2$ [34]

Solubility of the effective compounds of this invention in resists of the type described is substantial, i.e., well above the normal addition range. The amount of the additive employed is not critical; generally an amount equal to about 0.5–3 percent (by weight) is sufficient. The following specific examples will illustrate the improvement obtained by the additives of the present invention. They should not, however, be interpreted in a limiting sense.

EXAMPLES

To establish a basis for comparison, tests were first made with Shipley AZ–1350 without any additives. The resist was applied to a chromium coated glass plate. This was then spun so that the resulting coating, after baking at 150° C. for 10 minutes, was 6,000 A thick. The coated plate was then placed in a vacuum chamber and radiated with electrons accelerated at 15 KV. The plate was developed by washing with an NaOH solution and deionized water, and baked at 150° C. for 10 minutes. The following results were obtained:

| | Electron flux required to give a fully developed spot, μcoul/cm² |
|---|---|
| Bottle No. 1 (AZ-1350) | 8 |
| Bottle No. 2 (AZ-1350) | 24 |
| Bottle No. 3 (AZ-1350H) | 16 |
| Bottle No. 4 (AZ-1350) | 32 |

The following additives (in weight percent) were then tested with the Bottle No. 1 resist:

| | Flux, μcoul/cm² |
|---|---|
| 0.5–1.0% benzotriazole | 4 |
| 1.5% benzotriazole | 2 |
| 3.0% benzotriazole | 4 |
| 1.0–2.0% 5-methylbenzotriazole | 4 |

Thus, in each instance, the exposure required to give a fully developed spot was reduced by at least half, and in one instance it was reduced by a factor of four.

The following additives (in weight percent) were tested with the resist in Bottle No. 2:

| | Flux, μcoul/cm² |
|---|---|
| 1.0% 5-chlorobenzotriazole | 8 |
| 1.0% 5,6-dimethylbenzotriazole | 8 |
| 1.0% 1,2-naphthotriazole | 8 |

These three additives each reduced the exposure required to achieve a fully developed spot by a factor of three.

Lastly, the addition of 1.0 weight percent 5-methylbenzotriazole to the third bottle reduced the exposure required to achieve a fully developed spot from 16 to 8 μcoul/cm²ᵇ.

The very substantial differences in sensitivity from one bottle to another were found to be a function of shelf life. In general, the older the photoresist, the greater the electron flux needed to give a fully developed spot. This is shown graphically in FIG. 1. With a positive resist solubilizing reactions take place upon exposure, so the resist is completely exposed when, after development, there is none left. If the resist is overexposed, however, crosslinking reactions will be brought about, and the film will be insolubilized. In FIG. 1, Curve A is for a newly purchased bottle of AZ-1350, Curve B is for a bottle of the same material, but 2 weeks older, and Curve C is for a 3-month-old bottle of the same material (the two latter bottles were kept refrigerated). Curve D is for the cross-linking (overexposure) reactions, which are not effected by aging. Some of the additives may also lose their effectiveness after storage for a period of time. For example, quinazoline is one of the best additives reported below, but it was found to have lost its effectiveness after 1 week of room temperature storage.

FIG. 2 illustrates the effect of adding 1 weight percent benzotriazole to the resist. Again Curve A is for newly purchased AZ-1350, but Curve C is for resist from a 4-month-older bottle. It is significant to note that the additive not only reduces the flux required for full exposure, but also increases the amount of flux that is needed before cross-linking commences, as can be seen by comparing Curves A' and C' with Curve D of FIG. 1. Thus, the addition of triazole compounds widens the "window" which results in full exposure.

The following tests report results of other additives of the invention, including flux required to just solubilize a full spot and flux just causing insolubilizing, using bottle No. 4, the initial values being 32 and 160 μcoul/cm², respectively.

| Additivo | Weight percent | Solubilizing flux, μcoul/cm.² | Insolubilizing flux, μcoul/cm.² |
|---|---|---|---|
| Indazole | 1.8 | 16 | 160 |
| 5-nitroindazole | 1.3 | 8 | 160 |
| 5-aminoindazole | 1.4 | 8 | ---------- |
| 6-aminoindazole | 1.12 | 24 | 160 |
| 6,7-dihydro-5H-pyrrolotetrazole | 1.27 | 4 | 160 |
| 1,3,4-imidazopyridine | 1.05 | 16 | 160 |
| Imidazole | 1.13 | 8 | 560 |
| Quinazoline | 1.53 | 8 | 640 |
| Azauracil | 1 | 16 | 320 |
| Azacyclononan-2-one | 1.2 | 16 | 900 |
| 2,3-dimethylquinoxaline | 1 | 64 | 560 |
| 3,4-dinitroaniline | 1.85 | 40 | 480 |
| Indole | 1.25 | 24 | 560 |
| 5-nitroindoline | 1.0 | 32 | 720 |
| 1,3-di-(4-piperidyl)propane | 1.3 | 40 | 400 |
| 5-nitroindole | 1.0 | 32 | 400 |
| 3,4-dichloroaniline | 1.85 | 32 | 400 |
| 3,4-dimethylaniline | 1.85 | 32 | 720 |

The additives of the invention also increase the sensitivity of the resist to light. Referring to FIG. 3, it was found that the time needed for complete exposure of a 6,000 A film of AZ-1350 by a filtered (+3100 A) 150 watt xenon lamp was 3 minutes, as shown in Curve E. Two weight percent of benzotriazole was added to AZ-1350 which was 1 week older than the material used to generate Curve E, and exposure of the photoresist with the additive is plotted as Curve F. As can be seen, complete exposure time with the additive was reduced to 2 minutes, even with older material. Similar results have been observed for other additives of this invention.

It is to be understood that various changes in the details, steps, materials and arrangements of parts, which have been herein described and illustrated in order to explain the nature of the invention, may be made by those skilled in the art within the principle and scope of the invention as defined in the appended claims and their equivalents.

What is claimed is:

1. In a process for generating a pattern on a substrate coated with a positive photoresist comprising a quinone (1,2) diazide sulfonic acid ester, by exposure to an electron beam or light, the improvement comprising adding to said photoresist at least 0.5 weight percent of a compound selected from the group consisting of aromatic compounds having two to four nitrogen atoms, at least one of which is bonded to a hydrogen atom and containing no other heterocyclic atoms, said nitrogen atoms being bonded only to nitrogen, carbon or hydrogen atoms.

2. The process as claimed in claim 1, wherein the concentration of said compound in said photoresist is within the range of about 0.5 to about 3.0 weight percent.

3. In a process for generating a pattern on a substrate coated with a positive photoresist comprising a quinone (1,2 ) diazide sulfonic acid ester by exposure to an electron beam or light, the improvement comprising adding to said photoresist, prior to coating the substrate, at least 0.5 weight percent of a compound selected from the group consisting of benzotriazole
5-methylbenzotriazole
5-chlorobenzotriazole
5,6-dimethylbenzotriazole
1,2-naphthotriazole
indazole
5-nitroindazole
5-aminoindazole
6-aminoindazole
6,7-dihydro-5H-pyrrolotetrazole
1,3,4-imidazo-pyridine
imidazole
quinazoline
6-azauracil
2-azacyclononan-2-one, and
indole 4. The process as claimed in claim 3, wherein the concentration of said compound in said photoresist is within the range of about 0.5 to about 3.0 weight percent.

5. A process for generating a pattern on a substrate comprising:

coating said substrate with a uniform film of a positive photoresist composition comprising a quinone, (1,2) diazide sulfonic acid ester, said composition having added thereto at least 0.5 weight percent of a compound selected from the group consisting of benzotriazole
5-methylbenzotriazole
5-chlorobenzotriazole
5,6-dimethylbenzotriazole
1,2-naphthotriazole
indazole
5-nitroindazole
5-aminoindazole
6-aminoindazole
6,7-dihydro-5H-pyrrolotetrazole
1,3,4-imidazo-pyridine
imidazole
quinazoline
6-azauracil
azacyclononan-2-one, and
indole;

exposing areas of said substrate desired to be unprotected to sufficient electron beam or light radiation to solubilize the film on said areas;

dissolving and removing the areas of said film so exposed; and etching, plating or oxidizing the now-exposed portions of said substrate.

6. The process as claimed in claim 5, wherein the concentration of said compound in said photoresist is within the range of about 0.5 to about 3.0 weight percent.

7. In a process for generating a pattern on a substrate coated with a positive photoresist comprising a quinone (1,2) diazide sulfonic acid ester, by exposure to an electron beam or light, the improvement comprising adding to said photoresist at least 0.5 weight percent of a compound selected from the group consisting of 2,3-dimethylquinoxaline
3,4-dinitroaniline
5-nitroindoline
1,3-di-(4-piperidyl)propane
5-nitroindole
3,4-dichloroaniline, and
3,4-dimethylaniline.

8. The process as claimed in claim 7, wherein the concentration of said compound in said photoresist is within the range of about 0.5 to about 3.0 weight percent.

9. A positive photoresist composition characterized by increased sensitivity to light or electron beams and comprising a quinone (1,2) diazide sulfonic acid ester and at least 0.5 weight percent of a compound selected from the group consisting of aromatic compounds having two to four nitrogen atoms, at least one of which is bonded to a hydrogen atom and containing no other heterocyclic atoms, said nitrogen atoms being bonded only to nitrogen, carbon or hydrogen atoms.

10. The composition as claimed in claim 9, wherein the concentration of said compound in said photoresist is within the range of about 0.5 to about 3.0 weight percent.

11. A positive photoresist composition characterized by increased sensitivity to light or electron beams and comprising a quinone (1,2) diazide sulfonic acid ester and at least 0.5 weight percent of a compound selected from the group consisting of benzotriazole
5-methylbenzotriazole
5-chlorobenzotriazole
5,6-dimethylbenzotriazole
1,2-naphthotriazole
indazole
5-nitroindazole
5-aminoindazole
6-aminoindazole
6,7-dihydro-5H-pyrrolotetrazole
1,3,4-imidazopyridine
imidazole
quinozaline
6-azauracil
azacyclononan-2-one, and
indole.

12. The composition as claimed in claim 11, wherein the concentration of said compound in said photoresist is within the range of about 0.5 to about 3.0 weight percent.

13. A positive photoresist composition characterized by increased resistance to overexposure by light or electron beams and comprising a quinone (1,2) diazide sulfonic acid ester and at least 0.5 weight percent of a compound selected from the group consisting of 2,3-dimethylquinoxaline
3,4-dinitroaniline
5-nitroindoline
1,3-di-(4-piperidyl)propane
5-nitroindole
3,4-dichloroaniline, and
3,4-dimethylaniline.

14. The composition as claimed in claim 13, wherein the concentration of said compound in said photoresist is within the range of about 0.5 to about 3.0 weight percent.

* * * * *